April 30, 1968 V. J. WEBERS 3,380,825

PROCESS FOR PRODUCING IMAGES

Filed Nov. 27, 1964

*INVENTOR*

VINCENT JOSEPH WEBERS

BY Lynn Barratt Morris

*ATTORNEY*

United States Patent Office 3,380,825
Patented Apr. 30, 1968

3,380,825

PROCESS FOR PRODUCING IMAGES

Vincent Joseph Webers, Red Bank, N.J., assignor to E. I. du Pont de Nemours and Company, Wilmington, Del., a corporation of Delaware Filed Nov. 27, 1964, Ser. No. 414,193
6 Claims. (Cl. 96—35.1)

This invention relates to an image reproduction process and more particularly to a process for obtaining a reverse image in a photosensitive layer employing a photohardening or photopolymerization step.

By "photohardening" is meant, in general, the changes in various physical properties of certain photosensitive materials on exposure to actinic radiation. There will usually be an increase in hardness and tensile strength, or viscosity, a lowering of swelling, solubility or sensitivity to solvent attack, and an increase in the melting point or flow temperature. Photohardening is usually accomplished by photochemical reactions in which new chemical bonds are formed, that is through photopolymerization and photocrosslinking reactions.

By "reverse image" in the photosensitive layer, it is meant that the changes in the physical properties of the exposed and underexposed areas of the layer are the opposite of those obtained by the usual process of exposing the material to actinic radiation. In the usual exposure process, the areas of the layer that are exposed through the transparent portions of the process transparency are photohardened while the complementary adjoining areas of the layer masked by the opaque portions of the transparency are relatively unphotohardened. With a reverse image, the areas of the layer corresponding to the opaque areas of the process transparency are photohardened while the areas corresponding to the transparent areas of the transparency are without substantial photohardening. In developing the photosensitive layer, the unphotohardened areas can be softened and transferred to a separate receptor by thermal transfer or removed by solvent washout leaving the photohardened areas as a relief.

Solid compositions, capable of photopolymerization to rigid, insoluble, tough, structures are useful in making printing plates and are described in U.S. patents, Plambeck 2,760,863 and 2,791,504. Printing plates with uniform printing height can be produced directly by exposing to actinic light, through an image-bearing process transparency, a photopolymerizable layer coated on a suitable support, until substantially complete polymerization of the composition occurs in the exposed areas with substantially no polymerization in the non-exposed areas. Portions of the layer in the latter areas are generally removed by treatment with a suitable solvent in which the polymerized composition in the exposed areas is insoluble leaving a relief image of the text of the transparency suitable for direct use as a printing plate, especially for letterpress work or dry off-set. This operation is called "development." In assignee's pending application, Cohen and Webers, Serial No. 205,566, filed June 27, 1962 (U.S. Patent No. 3,264,103, August 2, 1966), there is disclosed a completely dry process for developing the relief image. In this process the layer is heated to the transfer temperature of the underexposed portion and then the molten, underexposed portions of the layer are absorbed in a porous matrix and removed, thus producing the relief image on the support.

Additionally, processes for producing copies of an image rather than a relief involving a photohardening step and a dry thermal transfer process are known. In these processes a photopolymerizable layer coated on a suitable support is exposed image-wise to a process transparency. The surface of the exposed layer is then pressed into contact with the image-receptive surface of a separate element. Subsequently, at least one of said elements is heated to a temperature above the transfer temperature of the underexposed portions of the layer and the two elements are separated whereby the thermally transferable, underexposed image areas of the layer transfer to the image-receptive element. This process is disclosed in U. S. Patent Burg and Cohen, 3,060,023. Related processes involving the transfer of pigments and dyes with the underexposed portions of the layer are disclosed in Burg and Cohen U.S. Patents 3,060,024 and 3,060,025, Oct. 23, 1963.

In the above described processes for producing physical changes in the photopolymerizable layer by exposure through a process transparency, the processes produce an image in the layer that is a copy of the original transparency, i.e., the opaque areas of the transparency are essentially unpolymerized in the layer while the area exposed through the transparent portions of the transparency are photopolymerized. It is not possible by the above described processes to obtain an image in the photosensitive layer that is the reverse of the process transparency, i.e., obtain a positive image from a negative transparency, or to obtain both a positive and negative image from one transparency whether a negative or a positive.

Accordingly, it is an object of this invention to provide a process for producing a reverse image in a photopolymerizable layer. It is another object to provide a process of obtaining a reverse image which is simple, quick and utilizes standard equipment. A more specific object is to provide an improved exposure step in a photopolymerization process for producing reverse photopolymerized images. Still further objects will be apparent from the following description of the invention.

These objects are accomplished by a process for producing a reverse image in a photopolymerizable thermoplastic layer, said layer being solid below 40° C. and containing an addition polymerization initiator activatable by actinic radiaton, said process comprising:

(A) Exposing said layer imagewise to actinic radiation while the surface of the layer has free access to a gaseous inhibitor so that the photoinitiator is exhausted in the exposed area and essentially no addition polymerization takes place in the exposed image areas, and (B) Exposing all of said layer to actinic radiation while preventing access of said inhibitor to the surface of said layer whereby addition polymerization takes place in areas that were not exposed in the original imagewise exposure. Step (A) can be accomplished by using a stencil, or in the case of an image-bearing transparency, by spacing its surface a slight distance from the photopolymerizable surface or by having a matte surface so that there is spaced point contact rather than uniform planar contact between the two surfaces.

After the exposure steps, the layer with the reverse image may be developed by a suitable operation, e.g., solvent washout, thermal transfer, etc., to produce either an image on a receptor or a relief suitable for printing. The image thus produced on the receptor will be the opposite of the original that was exposed to the photopolymerizable layer, i.e., if the original was a positive image (photographic positive), the image on the receptor will be a negative image. Likewise, if the layer was developed to produce a relief, the relief will print a copy of the original.

In the process of this invention, a preferred photosentitive layer is a photopolymerizable stratum which contains a polymeric binder, a polymerizable monomer and a photoinitiator each so selected and used in such proportions that the resulting stratum will be solid below 40° C. Exposure of this layer to a process transparency bearing an image, by the prior art methods, using appropriate means to overcome the inhibiting effects of atmospheric oxygen, e.g., exposure in vacuum frame or through a removable cover-sheet having low permeability to oxygen, will result in photohardening with an accompanying changes in various physical properties in the exposed areas without substantial photohardening in the underexposed, complementary, adjoining, image areas.

However, in the process of the invention, the initial image-wise exposure of the layer to actinic radiation is in the presence of a polymerization inhibitor, i.e., atmospheric oxygen, and the exposure (duration and intensity) is controlled such that the photoinitiator in the layer is exhausted in the exposed areas and little or no photohardening taking place. The conditions of exposure must be such that the rate of reaction of the photoinitiator cannot exceed the diffusion of the oxygen inhibitor into the coating. If it does, the inhibitor will be exhausted and polymerization will occur. In this respect, the appropriate range of concentrations of photoinitiator and exposure conditions must be selected.

Subsequently, the layer is given an overall exposure with the exclusion of the inhibitor or with a relatively high intensity source of actinic radiation to polymerize all the areas not exposed in the initial image-wise exposure. The areas exposed in the initial exposure will not polymerize since the photoinitiator has been exhausted in these areas. This second exposure is preferably accomplished by having a removable cover sheet capable of uniformly transmitting actinic radiation and having a low permeability rate to oxygen, e.g., sheet of polyethylene terephthalate film, in intimate contact with the layer. The exposure is then accomplished with the layer in a vacuum frame using a high intensity source of actinic radiation; this process is described in U.S. Patent Heiart 3,060,026. Alternately, the overall exposure can be by a high intensity source of actinic radiation in the presence of inhibitor provided that the speed of polymerization outruns the diffusion of any gaseous inhibitor present into the layer. When initiators are used that are thermally active as well as photosensitive, the second exposure to light may be omitted and instead the layer may be heated to effect polymerization in the under-exposed areas. The resulting image in the layer is a reverse image to that obtained by direct imagewise exposure.

After the exposure steps, the image in the layer can be developed in a variety of ways such as solvent washing, application of dyes or pigments which adhere to the tacky areas but not to photohardened areas, thermal transfer, diffusion of reagents into or through the layer, differential adhesion of exposed vs. underexposed areas, etc., all known in the art.

While the structures of the photopolymerizable elements during the various steps of the process of this invention are apparent from the description given below, for convenience representative elements are set forth in the attached drawing which constitutes a part of this application wherein.

Figure 1:
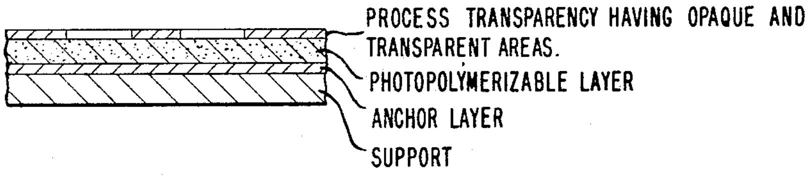
FIG. 1 is a vertical cross-sectional view of the type of photopolymerizable element prior to the initial exposure step.
Figure 2:
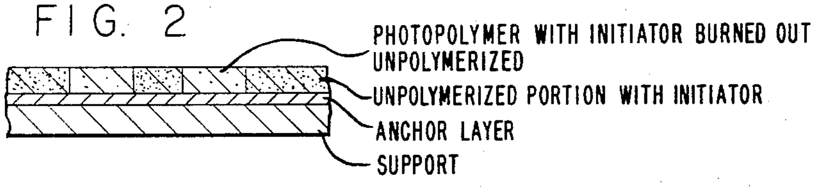
FIG. 2 is a vertical cross-sectional view of the same element after the initial exposure step.
Figure 3:
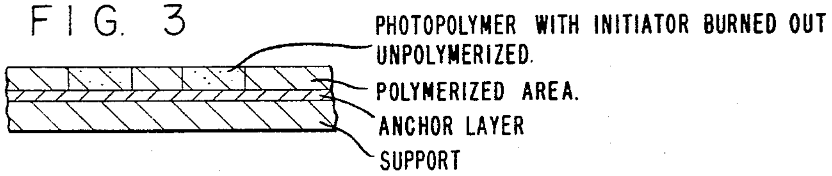
FIG. 3 is a vertical cross-sectional view of the same element after the overall exposure step.

One solid photosensitive layer useful in this invention is formed from a photopolymerizable composition which comprises:

(1) An organic polymeric binder that is solid at 50° C., 10 to 90 parts by weight, (2) An ethylenically unsaturated compound containing 1 or more terminal ethylenic groups, having a boiling point above 100° C. at normal atmospheric pressure and being capable of forming a high polymer by photoinitiated addition polymerization, 10 to 90 parts by weight, and (3) A free-radical generating addition polymerization initiator, activatable by radiation, 0.001 to 10.0 parts by weight.

In addition to the above constituents, the photopolymerizable layer can contain, if desired, (4) A thermal polymerization inhibitor, 0.001 to 2.0 parts by weight.

Components (1) and (2) can be combined as a single material serving the function of both monomer and polymer in which case the ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethyl polyamide, etc.

The photosensitive composition may also contain a chain transfer agent or polymerization accelerator including one or more of the chain transfer agents disclosed in U.S. Patent No. 3,046,127, July 24, 1962, in the amounts given in that patent, especially a polyethylene glycol of a molecular weight of about 500 to about 20,000. Also, esters and ethers of such polyethylene glycols are useful.

The instant invention is not limited to particular photopolymerizable compositions, and suitable compositions which can be used are described in Plambeck U.S. Patents 2,760,863 and 2,791,504. Other photopolymerizable compositions which can be used are described in the patents and U.S. applications of assignee as follows:

N-methoxymethyl polyhexamethylene adipamide mixtures of Saner, British specification No. 826,272, issued Sept. 23, 1959; linear polyamide compositions containing extralinear N-acrylyloxymethyl groups of U.S. Patent 2,972,540; polyvinyl acetal compositions having the extralinear vinylidene groups of U.S. Patent 2,929,710; polyester, polyacetal or mixed polyester acetal mixtures of U.S. Patent 2,892,716; the fusible blends of selected organic-soluble, base-soluble cellulose derivatives with addition-polymerizable components and photoinitiators of U.S. Patent 2,927,022; fusible polyvinyl alcohol derivatives of U.S. Patent 2,902,365; 1,3-butadiene compositions of McGraw, U.S. Patent 3,024,180.

The invention will be further illustrated by but is not intended to be limited to the following examples:

EXAMPLE I

A coating solution was prepared from 20 g. of a 30% by weight solution in acetone of cellulose acetate butyrate, 0.1% of anthraquinone by weight in 6.0 g. of polyethylene glycol diacrylate, and 25 milliliters of a 0.5% by weight of fuchsine (C.I. 42510) and acetone to make 30 g. The cellulose acetate butyrate contained 13% acetal groups, 37% butyryl groups, 2% hydroxyl groups and had a viscosity of 1.12–1.88 poises determined by ASTM method D–1343–54T in a solution described as Formula A, ASTM method D–871–54T. The polyethylene glycol diacrylate was derived from polyethylene glycol with an average molecular weight of 300.

The ingredients were mixed by continuous agitation with a magnetic stirrer. The composition was coated on an 0.004 inch-thick polyethylene terephthalate film support which was subcoated with vinylidene chloride/methyl acrylate/itaconic acid copolymer as disclosed in Alles et al., U.S. 2,779,684, to a wet coating thickness of 0.006 inch. The coating was dried in the dark at room temperature for two hours and had a smooth surface.

The surface of the coating was brought into contact with a matte surface negative halftone transparency, whereby there was point rather than planar contact between the two surfaces, and air had free access to the surfaces. The negative had an emulsion side matte surface which was composed of silicon dioxide particles in a gelatin binder. The silicon dioxide particles had an average diameter of 3 to 6 microns and were dispersed by milling in a gelatin binder. The particles were added to the gelatin solution in a ratio of 1 part of $SiO_2$ to 4 parts of gelatin. This composition when coated on the emulsion has a thickness in terms of the gelatin binder of 0.3–0.5 micron; thus the particles protruded from the binder to form the matte surface. It was then exposed through the negative. The exposure was to radiation from a 400-watt mercury vapor lamp at 13 inches for 20 minutes. After this initial imagewise exposure, a 0.0005-inch-thick film of polyethylene terephthalate was pressed into surface contact with the imagewise exposed coating.

The element was then given an overall exposure through the polyethylene terephthalate film to 8 passes in a vacuum printing frame (Fairchild Exposure Unit—Model M386.1) with the mercury arc lamps maintained at a distance of one and three-eighths inches, the lamps moving at a rate of 75 inches per minute in making the passes.

The 0.0005-inch film was stripped from the coating, the exposed coating was then brought into intimate contact with a sheet of white paper, and the resulting sandwich was heated by passing between two heated rolls. The rolls were heated to a temperature of 120° C. and applied a pressure of 7 pounds per linear inch. While still warm the two surfaces were stripped apart. The thermoplastic, photopolymerizable material that was exposed to actinic radiation during the initial exposure transferred from its original support to the paper forming a well defined, high contrast positive image on the paper. Thus a reverse, or positive image in this case, was obtained in the layer from exposure through a negative half-tone transparency.

EXAMPLE II

A coating solution was prepared from 6 g. of cellulose acetate butyrate, 5 g. of triethylene glycol diacrylate, 0.1 g. of phenanthrenequinone, 0.1 g. of Pontacyl Wool Blue (C.I. 50315) and acetone to make 30 g. The cellulose acetate butyrate contained 13% acetal groups, 37% butyryl groups, 2% hydroxyl groups and had a viscosity of 1.12–1.88 poises determined by ASTM method D–1343–54T in a solution described as Formula A, ASTM method D–871–54T.

The ingredients were mixed, coated on a subbed film support and dried as in Example I. The smooth dry surface of the photopolymerizable layer was brought into contact with a photographic negative transparency having a matte surface to provide point rather than uniform planar contact and exposed in the presence of air to a 2800-watt carbon arc for 3 minutes. The coating was at a distance of 72 inches from the arc. After this initial exposure, the transparency was removed and the coating was placed in a vacuum frame and given an overall exposure to a 2800-watt carbon arc for 1.5 seconds at 14 inches.

The coating was then developed as described in Example I to give a clear, sharp positive image on the receptor from a negative transparency.

EXAMPLE III

A coating solution was prepared by mixing 15 g. of a 20% by weight solution of cellulose acetate butyrate, 0.1 g. of Pontacyl Wool Blue (C.I. 50315), 3 g. of 0.1% of 2-ethylanthraquinone in triethylene glycol diacrylate and acetone to make 20 g. The cellulose acetate-butyrate contained 20.5% acetyl groups, 26% butyryl groups, 2.5% hydroxyl groups and had a viscosity of 9.0–13.5 poises determined by ASTM method D–1343–54T in a solution described as Formula A, ASTM method D–871–54T.

The ingredients were mixed, coated on a subbed film support and dried as set forth in Example I. The smooth coating was brought into contact with a positive transparency having a matte surface and exposed in the presence of air to a 2800-watt carbon arc at 72 inches for 5 minutes. After this initial exposure, the transparency was removed and the coating was placed in a vacuum frame and given an overall exposure for 5 seconds to a 2800-watt carbon arc lamp spaced 14 inches from the transparency.

The coating was then developed by thermal transfer as described in Example I to give a clear, sharp negative image on the receptor from a positive transparency.

EXAMPLE IV

A photopolymerizable coating solution was prepared by mixing 2 g. of 0.1% of benzoin methyl ether in pentaerythritol-triacrylate, 1 g. of polyvinyl butyral, 1 g. of dibutyl phthalate (plasticizer), 0.1 g. Pontacyl Wool Blue (C.I. 50315) and methylene chloride to make 23 g. The polyvinyl butyral had a molecular weight of 18,000, 7–9% hydroxyl (as polyvinyl alcohol) and 9.5–13% acetate content (as polyvinyl acetate). The specific gravity was 1.2, the viscosity was 50–80 cps. determined with 5 g. of resin made to 100 ml. with ethylene chloride at 20° C.

The ingredients were mixed, coated on a subbed film support and dried as set forth in Example I. The coating was brought into contact with a photographic negative transparency having a matte surface and exposed for 5 min. to a 2800-watt carbon arc lamp at 72 inches while air had free access to the coating. After this initial exposure, the transparency was removed and the coating was placed in a vacuum frame and given an overall exposure to a 2800-watt carbon arc lamp at 14 inches for 1 minute.

The coating was then developed by thermal transfer as described in Example I to give a sharp positive image on the receptor from a negative transparency.

EXAMPLE V

A photopolymerizable coating solution was prepared by mixing 6.25 g. of cellulose acetate-butyrate, 4.37 g. of cellulose acetate, 2.58 g. of pentaerythritol-triacrylate, 0.8 g. of polyethylene oxide having an average molecular weight of 4000 (available from Union Carbide as "Carbowax 4000"), 0.1 g. of Pontacyl Wool Blue (C.I. 50315), 1.41 g. of .3 g./150 ml. ethanol, 1.62 g of a solution containing 89% polyethyleneimine of molecular weight about 35,000 and 12.0% acetic acid in ethylene glycol monomethyl ether, .031 g. of phenanthrenequinone and methylene chloride to make 25 g. The cellulose acetate-butyrate contained 20.5% acetyl groups, 26% butyryl groups, 2.5% hydroxyl groups and had a viscosity of 9.0–13.5 poises determined by ASTM method D–1343–54T in a solution described as Formula A, ASTM method D–871–54T. The cellulose acetate contained 39.4% acetyl groups and 55% combined acetic acid and had a viscosity of 130–182 poises determined by ASTM method D–1343–56 in a solution described as Formula A, ASTM method D–87156.

The ingredients were mixed, coated, dried, and exposed as set forth in Example IV, except that the overall exposure was for 3 seconds at a distance of 14 inches.

The coating was then devloped by thermal transfer as described in Example I to give a clear, sharp positive image on the receptor from a negative transparency.

EXAMPLE VI

A photopolymerizable element having a polymerizable layer thickness of 40 mils was prepared from 680 g. of cellulose acetate succinate, 320 g. of triethylene glycol diacrylate containing 0.32 g. of anthraquinone, 0.32 g. of p-methoxyphenol, 0.32 g. of mucochloric acid and 6.5 g. of triethylamine was coated and dried on a subbed polyethylene terephthalate support as set forth in Example I.

The element was exposed imagewise to a negative process transparency having the matte surface of Example I. The exposure was through the support from a 4800-watt carbon arc lamp located 65 inches from the element and for a period of 30 minutes. After the initial exposure, the element was given an overall exposure for 4 minutes to the same arc lamp at 30 inches while in a vacuum frame.

The exposed element was removed from the vacuum frame and the unhardened areas of the photopolymerized layer were removed by spray washing the element for 2 minutes with a 0.04 N aqueous solution of NaOH.

After washing, a relief image was obtained that reproduced by printing with ink the opaque portions of the negative process transparency.

In carrying out the invention, it is important that there be an adequate supply of the inhibitor, e.g., oxygen, present during the first exposure so that the photoinitiator will be exhausted in the exposed areas and that the inhibitor not be present in significant amounts during the second exposure so that the photoinitiator is exhausted during the second exposure.

Preferably, the addition polymerizable monomer is capable of crosslinking during the second exposure and has at least two, e.g., 2 to 6, terminal ethylenic groups. Suitable such compounds are listed in the Burg and Cohen patents and the other patents that are cited above.

This invention covers broadly the use of photopolymerizable compositions. Such compositions have the advantage that a single photon results in the formation of a large number of new chemical bonds through polymerization, thus giving elements which are generally of useful photographic speed. In addition, the monomer used often serves as a plasticizer for the unexposed material and so convenient operating temperatures are readily obtained, although inert plasticizers may be used if desired to adjust operating temperature. In addition, photopolymerizable compositions are readily formulated from commercial materials, and they are relatively inexpensive.

Photopolymerizable compositions useful in this invention are described in the patents and applications listed above. These compositions usually comprise polymeric binders, addition-polymerizable ethylenically unsaturated compounds, addition-polymerization initiators and, if desired, thermal, addition-polymerization inhibitors.

Suitable binders include the thermoplastic polymers disclosed in Burg and Cohen, U.S. Patent 3,060,023, e.g., cellulose esters or ethers, polyalkylene ethers, condensation polymers of glycols with dibasic acids, polymers and copolymers of vinyl esters, acrylic acids and esters, etc. In that same patent are also disclosed suitable fillers or reinforcing agents which are useful, for example, in improving the strength of the composition. Some materials, e.g., the acrylate and methacrylate esters of poly (vinyl acetate co vinyl alcohol), are capable of service simultaneously as both the polymeric binder and as the ethylenically unsaturated, addition polymerizable compound (i.e., an unsaturated polymer, capable of further polymerization).

Suitable addition-polymerizable ethylenically unsaturated compounds, in addition to the triethylene glycol diacrylate and polyethylene glycol diacrylataes with an average molecular weight of the diol precursor of 200 to 600, include vinylidene monomers, particularly the vinyl monomers described in U.S. Patent 2,791,504, column 17, line 62 to column 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O—OCRCOOH_2CH_2OCH_2CH_2OH$$

where R is a divalent hydrocarbon radical, e.g., methylene or ethylene. Other useful vinyl monomers include acrylate and methylacrylate esters of polyhydroxy compounds, e.g., glycerol, pentaerythritol 1,2,4-butanetriol, 1,4: 3,6-dianhydro-D-glucitol, glucose, mannose, sucrose, inositol, sorbitol an mannitol.

The photoinitiator should be soluble in the coating and should initiate photohardening of the monomer chosen. A preferred class of free-radical generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone,
1-chloro-anthraquinone,
2-chloroanthraquinone,
2-methylanthraquinone,
2-ethyl-anthraquinone,
2-tert-butylanthraquinone,
octamethylanthraquinone,
1,4-naphthoquinone,
9,10-phenanthrenequinone,
1,2-benzanthraquinone,
2,3-benzanthraquinone,
2-methyl-1,4-naphthoquinone,
2,3-dichloronaphthoquinone,
1,4-dimethylanthraquinone,
2,3-dimethylanthraquinone,
2-phenylanthraquinone,
2,3-diphenylanthraquinone,
sodium salt of anthraquinone alphasulfonic acid,
3-chloro-2-methylanthraquinone,
retenequinone,
7,8,9,10-tetrahydronaphthacenequinone, and
1,2,3,4-tetrahydrobenz(a)anthracene-7,12-dione.

Other photoinitiators which are also useful, even though some may be thermally active at temperatures as low as 85° C., are described in Plambeck U.S. Patent 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-allylbenzoin, and α-phenylbenzoin. A range of concentrations of photo-initiator coating thickness and exposure conditions may be chosen for the imagewise exposure, with the limitation that the speed of polymerization should not outrun diffusion of the inhibitor (e.g., atmospheric oxygen) into the coating.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

During the initial imagewise exposure the use of atmospheric oxygen as the inhibitor is preferred. However, the use of other gaseous or volatile inhibitors is possible, e.g., sulfur dioxide, iodine, nitric oxide, formaldehyde, p-nitroso dimethyl aniline or hydrogen sulfide. It is also possible to use an inhibitor that could be removed in a chemical reaction, e.g., pyrogallol which could be destroyed by treatment with ammonia in the presence of oxygen.

The exposure of the image to actinic radiation may be through a two-tone image or a process transparency, e.g., a process negative or positive (an image-bearing transparency consisting solely of substantially opaque and substantially transparent areas where the opaque areas are substantialy of the same optical density, the so called line or halftone negative or positive). The image or transparency may or may not be in operative contact, e.g., contact exposure or projection exposure. It is possible to expose through paper or other light transmitting materials. A stronger light source or longer exposure times must be used.

Since free-radical generating addition-polymerization initiators activatable by actinic radiation generally exhibit their maximum sensitivity in the ultra-violet range, the radiation source should usually furnish an effective amount of this radiation. Such sources include carbon arcs, mercury-vapor lamps, fluorescent lamps with ultraviolet radiation-emitting phosphors, argon glow lamps, electronic flash units and photographic flood lamps. Of these, the mercury-vapor lamps are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

The photohardenable composition is preferably coated on a base support. Suitable support materials are stable at the heating temperatures used in the development steps. Suitable bases or supports include those disclosed in U.S. Patent 2,760,863, glass, wood, paper, cloth, cellulose esters, e.g., cellulose acetate, cellulose propionate cellulose butyrate etc., and other plastic compositions, etc. The support may have in or on its surface and beneath the photopolymerizable stratum an antihalation layer as disclosed in said patent or other substrata needed to facilitate anchorage to the base.

The receptor support to which the image may be transferred must also be stable at the process temperatures. The particular support used is dependent on the desired use for the transferred image and on the adhesion of the image to the base. Suitable supports include paper including bond paper, resin and clay sized paper, resin coated or impregnated paper, cardboard, metal sheets, foils and meshes e.g., aluminum, copper, steel, bronze, etc.; wood, glass, nylon, rubber, polyethylene, linear condensation polymers such as the polyesters e.g., polyethylene terephthalate, regenerated cellulose, cellulose esters e.g., cellulose acetate, silk, cotton, and viscose rayon fabrics or screens.

The processes of the present invention are useful whenever a reverse image is desired. It is particularly useful in the graphic arts, wherein it will allow printers to prepare proofs from positive transparencies and have applications in color proofing. Also, the process would permit the proofing of either positive or negative transparencies with one type of photohardenable composition.

The process of the invention has the further advantage that it is simple, utilizes air or inexpensive chemicals as the photopolymerization inhibitor and does not require special or expensive apparatus.

I claim:

1. A process for producing a reverse image in a photopolymerizable layer, said layer being solid below 40° C. and containing a photoinitiator, said process comprising:

(A) exposing said layer imagewise to actinic radiation while the surface of the layer has free access to a gaseous polymerization inhibitor to actinic radiation so that the photoinitiator is exhausted in the exposed area and essentially no photohardening takes place in the exposed image areas, and (B) exposing all of said layer to actinic radiation while preventing access of a gaseous polymerization inhibitor to the surface of the layer whereby photohardening takes place in the areas that were not exposed in the original imagewise exposure.

2. A process for producing a reverse image in a photopolymerizable thermoplastic solid layer, said layer being solid below 40° C. and containing a free-radical generating addition polymerization initiator activatable by actinic radiation, said process comprising:

(A) exposing said layer imagewise to actinic radiation while the surface of the layer has free access to a gaseous addition polymerization inhibitor so that the photoinitiator is exhausted in the exposed area and essentially no photopolymerization takes place in the exposed image areas, and (B) exposing all of the layer to actinic radiation while preventing access of a gaseous addition polymerization inhibitor to the surface of the layer whereby addition polymerization takes place in areas of the layer that were not exposed during the original imagewise exposure.

3. A process according to claim 2 wherein said gaseous inhibitor is oxygen in concentration of 5 to 100% of a diluting gas.

4. A process according to claim 2 wherein the imagewise exposure is through an image-bearing transparency having a matte surface in contact with the photopolymerizable layer.

5. A process according to claim 2 wherein said solid layer comprises (1) an organic thermoplastic polymer binder that is solid at 50° C., (2) at least one normally non-gaseous ethylenically unsaturated compound containing at least one terminal ethylenic group having a boiling point above 100° C. at normal atmospheric pressure and being capable of forming a high polymer by photoinitiated addition polymerization; said constituents (1) and (2) and said initiator being present in the respective parts by weight 10 to 90; 10 to 90 and 0.001 to 10.0.

6. A process according to claim 5 wherein the unsaturated compound is a crosslinking compound and contains at least two terminal ethylenic groups.

References Cited

UNITED STATES PATENTS

| | | | |
|---|---|---|---|
| 2,892,712 | 6/1959 | Plambeck | 96—35.1 |
| 3,144,331 | 8/1964 | Thommes | 96—27 |

NORMAN G. TORCHIN, *Primary Examiner.*

R. SMITH, *Assistant Examiner.*